US012597890B2

(12) United States Patent　(10) Patent No.:　US 12,597,890 B2
Kundur et al.　(45) Date of Patent:　Apr. 7, 2026

(54) OVER TEMPERATURE PROTECTION OF LDO CONTROLLING THE RF POWER AMPLIFIER COLLECTOR VOLTAGE

(71) Applicant: Skyworks Solutions, Inc., Irvine, CA (US)

(72) Inventors: Vinay Kundur, Milpitas, CA (US); David Steven Ripley, Cedar Rapids, IA (US)

(73) Assignee: Skyworks Solutions, Inc., Irvine, CA (US)

( * ) Notice: Subject to any disclaimer, the term of this patent is extended or adjusted under 35 U.S.C. 154(b) by 431 days.

(21) Appl. No.: 18/135,044

(22) Filed: Apr. 14, 2023

(65) Prior Publication Data

US 2023/0378917 A1　Nov. 23, 2023

Related U.S. Application Data

(60) Provisional application No. 63/331,681, filed on Apr. 15, 2022.

(51) Int. Cl.
| *H03F 1/30* | (2006.01) |
| *H03F 1/02* | (2006.01) |
| *H03F 1/52* | (2006.01) |
| *H03F 3/24* | (2006.01) |
| *H03F 3/45* | (2006.01) |

(52) U.S. Cl.
CPC ........... *H03F 1/523* (2013.01); *H03F 1/0227* (2013.01); *H03F 3/245* (2013.01); *H03F 3/45475* (2013.01); *H03F 2200/447* (2013.01); *H03F 2200/451* (2013.01); *H03F 2200/468* (2013.01)

(58) Field of Classification Search
CPC ......................................................... H03F 1/30
USPC ........................................ 330/289, 297, 296
See application file for complete search history.

(56) References Cited

U.S. PATENT DOCUMENTS

| 6,639,470 | B1 | 10/2003 | Andrys et al. |
| 7,095,257 | B2 | 8/2006 | Whittaker et al. |
| 7,443,246 | B2 | 10/2008 | Andrys et al. |
| 7,538,636 | B2 | 5/2009 | Takayama et al. |
| 7,855,619 | B2 | 12/2010 | Takayama et al. |
| 8,035,460 | B2 | 10/2011 | Nakanishi et al. |
| 8,945,729 | B1 | 2/2015 | Hill et al. |
| 9,817,416 | B2 | 11/2017 | Gebeyehu et al. |
| 10,156,860 | B2 | 12/2018 | Zhou |
| 10,224,876 | B2 | 3/2019 | Gorbachov et al. |
| 10,263,602 | B2 | 4/2019 | Caron et al. |
| 10,284,177 | B2 | 5/2019 | Caron et al. |
| 10,310,527 | B2 | 6/2019 | Gebeyehu et al. |

(Continued)

*Primary Examiner* — Henry Choe
(74) *Attorney, Agent, or Firm* — Knobbe, Martens, Olson & Bear, LLP

(57) ABSTRACT

A power control circuit coupled to a power amplifier, said power control circuit comprising: a first circuit including a power supply and a first transistor to provide a first current to the power amplifier through the first transistor; a second circuit to provide a second current to the power amplifier, the power dissipation of the first current being dependent on the second current of the power amplifier; a protective circuit coupled to the second circuit, the protective circuit configured to pull down a voltage of the second circuit when the temperature of the power control circuit exceeds a threshold temperature, such that the second current provided to the power amplifier by the second circuit is reduced and the power dissipation in the first transistor of the first circuit is reduced with increasing temperature.

20 Claims, 8 Drawing Sheets

(56) References Cited

U.S. PATENT DOCUMENTS

| | | | |
|---|---|---|---|
| 10,642,296 | B2 | 5/2020 | Gebeyehu et al. |
| 10,838,446 | B2 | 11/2020 | Liang et al. |
| 10,951,178 | B2 | 3/2021 | Ripley et al. |
| 11,073,854 | B2 | 7/2021 | Zhou |
| 11,088,675 | B2 | 8/2021 | Caron et al. |
| 11,256,281 | B2 | 2/2022 | Liang et al. |
| 11,281,247 | B2 | 3/2022 | Liang et al. |
| 11,556,144 | B2 | 1/2023 | Onody et al. |
| 11,614,760 | B2 | 3/2023 | Liang et al. |
| 11,646,701 | B2 | 5/2023 | Ripley et al. |
| 11,681,316 | B2 | 6/2023 | Zhou |
| 11,822,360 | B2 | 11/2023 | Onody et al. |
| 2019/0165747 | A1 | 5/2019 | Couglar et al. |
| 2019/0229682 | A1 | 7/2019 | Gorbachov et al. |
| 2021/0344327 | A1 | 11/2021 | Caron et al. |
| 2022/0334606 | A1 | 10/2022 | Liang |
| 2022/0413533 | A1 | 12/2022 | Liang et al. |
| 2023/0100609 | A1 | 3/2023 | Liang et al. |
| 2023/0378917 | A1 | 11/2023 | Kundur et al. |

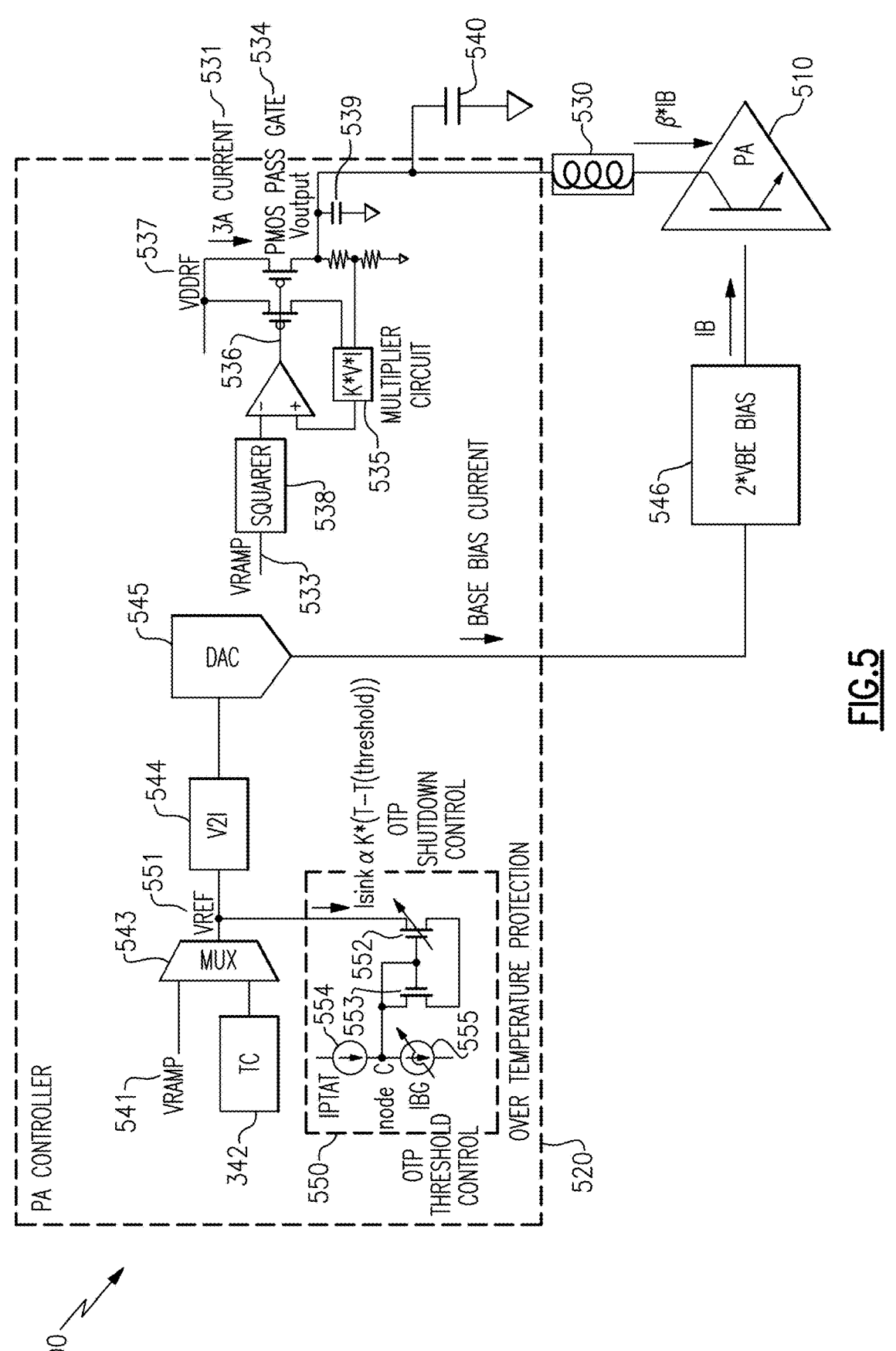
_FIG.5_

OVER TEMPERATURE PROTECTION OF LDO CONTROLLING THE RF POWER AMPLIFIER COLLECTOR VOLTAGE

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57.

BACKGROUND

Field

Embodiments of the invention relate to a power amplifier. Embodiments of the invention also relate to a method of controlling a power amplifier.

Description of the Related Technology

The disclosed technology relates to a control circuit for a power amplifier. In global system for mobile communications (GSM) and general packet radio service (GPRS) wireless applications, power amplifiers are commonly used and required to operate under a wide variety of operating conditions, such as variations in temperature. Normally, the output power of a power amplifier (PA) is set by an external voltage reference ($V_{RAMP}$). Once this reference voltage is applied, the output power variations with respect to frequency, input power, supply voltage, and temperature must be limited. To accomplish output power control and to limit power variations, a control system is needed. This is often established by means of analog amplitude control loops (e.g. power amplifier controlling integrated circuit).

FIG. 1 shows a schematic demonstration of an amplification module 100 includes a power amplifier (PA) controller 110 coupled to a power amplifier (PA) 120. PA 120 is configured to draw a supply current and receive a supply voltage from PA controller 110. For example, the supply voltage may be a collector voltage of PA 120, and the supply current may be a collector current of PA 120. Also, PA 120 is configured to receive a base current which may be provided by the PA controller 110 at the base of PA 120.

As shown in FIG. 1, the controller circuit 110 includes a voltage regulator, such as a low dropout voltage regulator (LDO) 130, which is an important part of most power supplies that regulates the output voltage and maintain the voltage within a specified range. The output of LDO circuit 130 is coupled to the collector of PA 120 through an inductor 131. The output of LDO circuit 130 is also coupled to a capacitor 132 which is grounded. The controller circuit 110 also includes a base bias circuit 140 which is coupled to the base of PA 120 to provide a base bias current.

The LDO circuit 130 may include a power transistor which in examples may be a P-channel metal-oxide-semiconductor (PMOS). The power transistor is also called pass transistor or pass gate, which is to regulate the output of the LDO circuit to the collector of PA 120. When the collector voltage of PA 120 is set by the LDO in PA controller 110, all PA current flows through the PMOS pass gate of LDO 130. This current can be relatively high which results in high power dissipation across the PMOS pass gate of the LDO. This high power dissipation causes die temperature to increase and potentially destroys the PMOS pass gate. Therefore, an over temperature protection is desired to avoid high power dissipation across the PMOS pass gate when the temperature of PA controller 110 increases.

A previous solution for over temperature protection is configured to reduce the current flowing through the PMOS pass gate by pulling up the gate voltage of PMOS pass gate. However, this type of protective circuit may have problems that lead to an increase in the resistance of the PMOS and an increase in the power dissipation of the PMOS before reducing the current. The increase in power dissipation may still increase the chance of PMOS damage. Therefore, there is a need to protect the PMOS pass gate from heating up by an over temperature detection and protection mechanism.

SUMMARY

According to one embodiment there is provided, a power control circuit coupled to a power amplifier, said power control circuit comprising: a first circuit including a power supply and a first transistor to provide a first current to the power amplifier through the first transistor; a second circuit to provide a second current to the power amplifier, the power dissipation of the first current being dependent on the second current of the power amplifier; a protective circuit coupled to the second circuit, the protective circuit configured to pull down a voltage of the second circuit when the temperature of the power control circuit exceeds a threshold temperature, such that the second current provided to the power amplifier by the second circuit is reduced and the power dissipation in the first transistor of the first circuit is reduced with increasing temperature.

In one example, the protective circuit is coupled to the second circuit at a reference node, such that the voltage at the reference node is pulled down by the current generated by the protective circuit.

In one example, the protective circuit comprises: a proportional-to-absolute-temperature-current-source which is configured to sense the temperature of the power control circuit; a bandgap-reference-current-source which is configured to set a threshold current corresponding to a threshold temperature; a current mirror comprising a second transistor and a third transistor with their gates connected to each other, coupled between a node where the proportional-to-absolute-temperature-current-source and the bandgap-reference-current-source are connected and the reference node of the second circuit.

In one example, the first circuit is a voltage regulator which further comprises: an output coupled between the first transistor and the power amplifier which is adapted to deliver a regulated output voltage to the power amplifier; a differential amplifier configured to provide a feedback from the output voltage to the first transistor, the differential amplifier comprises: a first input configured to provide a first reference voltage to the differential amplifier; a second input configured to provide a feedback voltage; and an output of control signal coupled to the first transistor.

In one example, the second circuit comprises: a second reference voltage; a voltage-to-current converter configured to convert the reference voltage to a base bias current.

In one example, the first circuit further comprises: a squarer circuit coupled between the first reference voltage and the first input of the differential amplifier; a fourth transistor coupled between the gate of the first transistor and the output of the differential amplifier; a multiplier circuit coupled to the second input of the differential amplifier at one side and coupled to the drains of the first and fourth transistors at another side, which is configured to receive the voltage and current from the first and fourth transistors and output a feedback voltage to the second input of the differential amplifier.

In one example, the second circuit further comprises: a temperature compensation reference; a multiplexer configured to receive the temperature compensation reference and the reference voltage and to output a multiplexed voltage to the voltage-to-current converter.

In one example, the second circuit further comprises a digital-to-analog converter coupled to the voltage-to-current converter.

In one example, the first circuit is coupled to the power amplifier through an inductor.

In one example, the second circuit is coupled to the power amplifier through a base current converter, which is configured to convert the base bias current to the second current provided to the power amplifier.

In one example, the temperature threshold is set at between 130 to 160° C.

In one example, the first current is a collector current of the power amplifier.

In one example, the second current is a base current of the power amplifier.

According to another embodiment there is provided, a method of controlling a power amplifier, the method comprising: coupling a power supply and a first transistor of a first circuit to the power amplifier for providing a first current to the power amplifier through the first transistor; coupling a second circuit to the power amplifier for providing a second current to the power amplifier, the power dissipation of the first current being dependent on the second current of the power amplifier; coupling a protective circuit to the second circuit; pulling down a voltage of the second circuit when a temperature of the power control circuit exceeds a threshold temperature; reducing the second current provided to the power amplifier by the second circuit; and reducing a power dissipation in the first transistor of the first circuit with increasing temperature.

In one example, the method of controlling a power amplifier further comprises coupling the protective circuit to the second circuit at a reference node, such that the voltage at the reference node is pulled down by the current generated by the protective circuit.

In one example, the method of controlling a power amplifier further comprises: sensing the temperature by a proportional-to-absolute-temperature-current-source; setting a threshold current corresponding to a threshold temperature by a bandgap-reference-current-source; coupling a node where the proportional-to-absolute-temperature-current source and the bandgap-reference-current-source are connected with the reference node of the second circuit through a current mirror, wherein the current mirror comprises a second transistor and a third transistor with their gates connected to each other.

In one example, the first circuit is a voltage regulator which further comprises: coupling an output between the first transistor and the power amplifier for delivering a regulated output voltage to the power amplifier; providing a feedback from the output voltage to the first transistor by a differential amplifier, wherein providing a first reference voltage to a first input of the differential amplifier; providing a feedback voltage to a second input of the differential amplifier; and coupling an output of control signal to the first transistor.

In one example, the second circuit comprises: applying a second reference voltage; converting the reference voltage to a base bias current by a voltage-to-current converter.

In one example, the first circuit further comprises: coupling a squarer circuit between the first reference voltage and the first input of the differential amplifier; coupling a fourth transistor between the gate of the first transistor and the output of the differential amplifier; coupling a multiplier circuit to the second input of the differential amplifier at one side and coupled to the drains of the first and fourth transistors at another side; receiving the voltage and current from the first and fourth transistors; and outputting a processed signal to the second input of the differential amplifier.

In one example, the second circuit further comprises: applying a temperature compensation reference; receiving the temperature compensation reference and the reference voltage and outputting a multiplexed voltage to the voltage-to-current converter by a multiplexer.

In one example, the second circuit further comprises coupling a digital-to-analog converter to the voltage-to-current converter.

In one example, the method of controlling a power amplifier further comprises coupling the first circuit to the power amplifier through an inductor.

In one example, the method of controlling a power amplifier further comprises coupling the second circuit to the power amplifier through a base current converter and converting the base bias current to a current provided to the power amplifier.

In one example, the method of controlling a power amplifier further comprises setting the temperature threshold at between 130 to 160° C.

Still other aspects, embodiments, and advantages of these exemplary aspects and embodiments are discussed in detail below. Embodiments disclosed herein may be combined with other embodiments in any manner consistent with at least one of the principles disclosed herein, and references to "an embodiment," "some embodiments," "an alternate embodiment," "various embodiments," "one embodiment" or the like are not necessarily mutually exclusive and are intended to indicate that a particular feature, structure, or characteristic described may be included in at least one embodiment. The appearances of such terms herein are not necessarily all referring to the same embodiment.

BRIEF DESCRIPTION OF THE DRAWINGS

Various aspects of at least one embodiment are discussed below with reference to the accompanying figures, which are not intended to be drawn to scale. The figures are included to provide illustration and a further understanding of the various aspects and embodiments, and are incorporated in and constitute a part of this specification, but are not intended as a definition of the limits of the invention. In the figures, each identical or nearly identical component that is illustrated in various figures is represented by a like numeral. For purposes of clarity, not every component may be labeled in every figure. In the figures:

FIG. 5 is a detailed circuit diagram of an amplification module 500 including a protective circuit for over temperature protection according to aspects of the present invention;

DETAILED DESCRIPTION

Aspects and embodiments described herein are directed to a power control circuit coupled to a power amplifier, said power control circuit comprising: a first circuit including a power supply and a first transistor to provide a first current to the power amplifier through the first transistor; a second circuit to provide a second current to the power amplifier, the power dissipation of the first current being dependent on the second current of the power amplifier; a protective circuit coupled to the second circuit, the protective circuit configured to pull down a voltage of the second circuit when the temperature of the power control circuit exceeds a threshold temperature, such that the second current provided to the power amplifier by the second circuit is reduced and the power dissipation in the first transistor of the first circuit is reduced with increasing temperature.

It is to be appreciated that embodiments of the methods and apparatuses discussed herein are not limited in application to the details of construction and the arrangement of components set forth in the following description or illustrated in the accompanying drawings. The methods and apparatuses are capable of implementation in other embodiments and of being practiced or of being carried out in various ways. Examples of specific implementations are provided herein for illustrative purposes only and are not intended to be limiting. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms.

A previous over temperature protection in power amplifier modules is configured at a LDO circuit in a power control circuit. The over temperature protection controls the PMOS pass gate of the LDO circuit and reduces the current through the PMOS pass gate by pulling up the gate voltage of the PMOS pass gate. However, this may lead to an increase in the resistance of the PMOS and therefore, an increase in the power dissipation of PMOS before reducing the current. The increase in power dissipation may still increase the chance of PMOS damage. In order to avoid the problem, this invention relates to an improved over temperature protection circuit that is configured at a base bias circuit instead of at a LDO circuit. The improved over temperature protection circuit protects the PMOS pass gate by controlling the base current of PA which subsequently controls the collector current of PA and the current flowing through PMOS pass gate. The improved circuit avoids the control from the gate of PMOS and directly controls the current flowing through the PMOS pass gate.

Figure 1:
FIG. 1 is a schematic block diagram of an amplification module 100 including a power control circuit and a coupled power amplifier according to aspects of the present invention.
Figure 2:
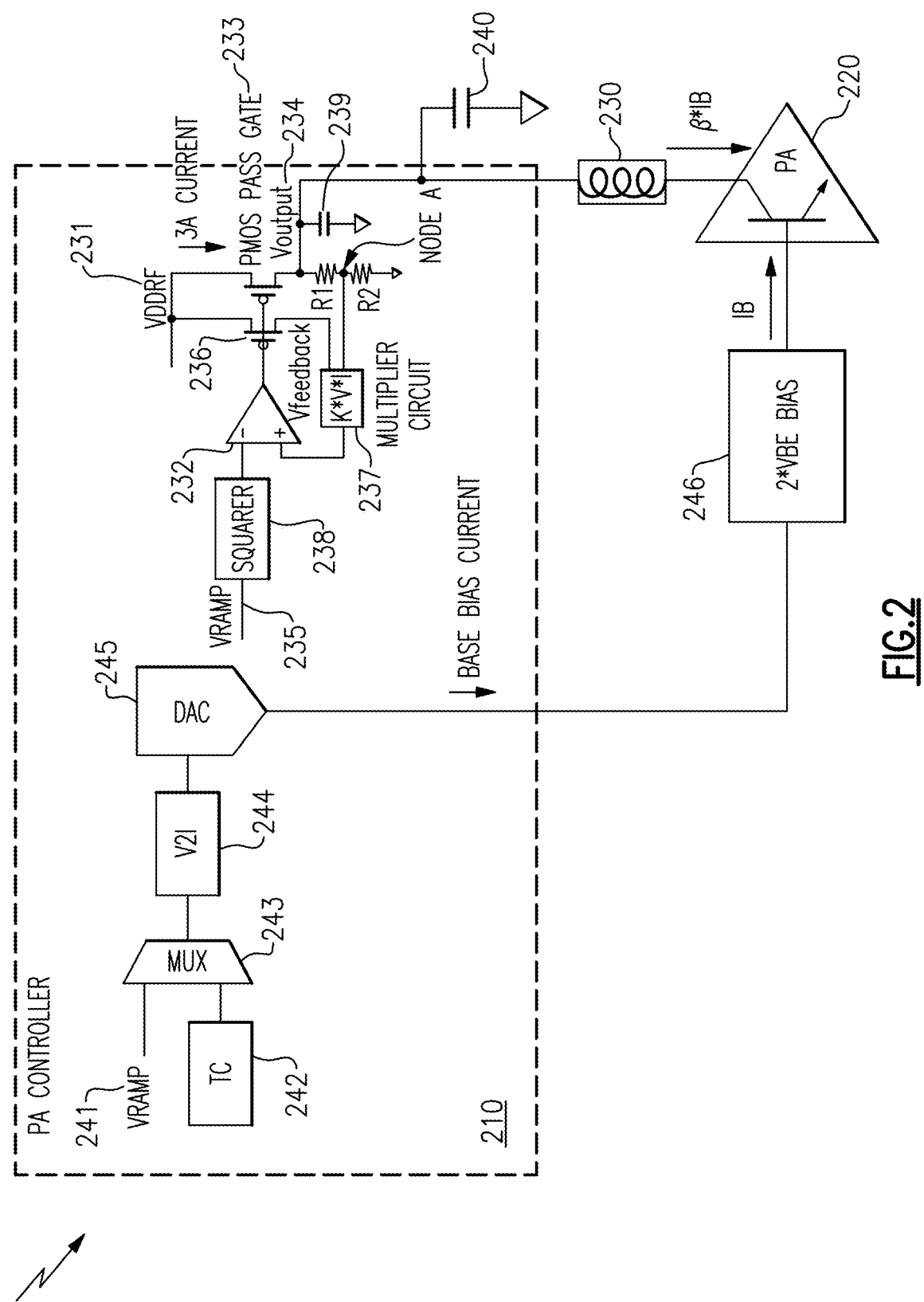
FIG. 2 is a detailed circuit diagram of a basic amplification module 200 including a power control circuit and a power amplifier according to aspects of the present invention.

FIG. 2 shows an amplification controlling module 200 including a PA control circuit 210 and a PA 220. The PA control circuit 210 comprises two sets of circuit, namely a LDO circuit and a base bias circuit. The collector of PA 220 is coupled to an output of LDO regulator circuit through an inductor 230. A capacitor 240 is also coupled to a node between the output of LDO regulator circuit and inductor 230. In some embodiment, inductor 230 may be a PA choke or a load inductor used for getting its gain. Capacitor 240 may be an off-chip decoupling capacitor. Decoupling capacitors are used to decouple one part of the circuit from another, in order to shunt noise caused by other circuit elements and to reduce the effect on the rest of the circuit. In some embodiments, the capacitance of capacitor 240 may be between 2 nF to 20 nF. The base of PA 220 is coupled to the base bias circuit which provides a base bias current to PA 220. The collector current of PA 220 is provided and controlled by the output of LDO circuit.

In some embodiments, the LDO circuit includes a supply voltage VDD 231, a differential amplifier (also called error amplifier) 232, a power transistor (also called pass gate) 233, an output voltage ($V_{output}$) 234, and two resistors (R1 and R2) as a voltage divider. In some embodiments, the power transistor 233 may be a PMOS which is referred to as a PMOS pass gate 233 in the following descriptions.

In some embodiments, the differential amplifier 232 may be an operational amplifier (op-amp). As shown in FIG. 2, a control voltage ($V_{RAMP}$) 233 is coupled to the negative terminal of differential amplifier 232, which serves as an input of power control circuit 210. Control voltage $V_{RAMP}$ 233 is a DC reference voltage that is utilized to determine a level of DC power that power control circuit 233 provides to power amplifier 220. In some embodiments, the control voltage $V_{RAMP}$ 233 may provide a voltage approximately between 0.25 to 1.5 volts for a proper operation. A feedback voltage ($V_{feedback}$) is coupled to the positive terminal of differential amplifier 232, which monitors the fraction of the output voltage determined by the resistor ratio of R1 and R2. The output of differential amplifier 232 is coupled to the gate of PMOS pass gate 233, in order to control an output voltage of the LDO circuit. The main conduction path of the PMOS pass gate 233 is connected in a path between the voltage supply VDD 231 and the output voltage $V_{output}$ 234 of the LDO circuit. Differential amplifier 232 is configured to compare feedback voltage ($V_{feedback}$) to control voltage ($V_{RAMP}$) 233 and output a control voltage to the gate of the PMOS pass gate 233 which corresponds to the difference between $V_{feedback}$ and $V_{RAMP}$.

In some embodiments, the LDO regulator circuit may also include a transistor 236 and an analog multiplier circuit 237. Analog multiplier circuit 237 may be coupled to the positive terminal of differential amplifier 232 which accordingly provides a feedback voltage to differential amplifier 232. Transistor 236 may be coupled between VDD 231 and analog multiplier circuit 237 which also forms a part of the feedback loop of the differential amplifier 232. In some embodiments, transistor 236 may be an identical PMOS transistor matched with PMOS pass gate 233. Transistor 236 may be configured such that a current controlled by transistor 236 is directly proportional to a current controlled by the PMOS pass gate 233. This may be achieved by a configuration of a current mirror by transistor 236 and PMOS pass gate 233.

As shown in FIG. 2, a current mirror is constructed by connecting the gate of transistor 236 to the gate of the PMOS pass gate 233. The gate of transistor 236 is also coupled to the output of differential amplifier 223, the source of transistor 236 is coupled to VDD 231, and the drain is coupled to analog multiplier circuit 237. PMOS pass gate 233 is also coupled to analog multiplier circuit 237 through its drain.

Current controlled by transistor 236 and drawn by the analog multiplier circuit 237 is referred to as a sensing current ($I_{sense}$). Current controlled by PMOS pass gate 233 and drawn by the collector of PA 220 is referred to as a collector current ($I_C$). The current mirror formed by transistor 236 and PMOS pass gate 233 has a mirror ratio equal to K, where K is determined by the size of PMOS pass gate 233 with respect to the size of transistor 236. Analog multiplier circuit 238 may be configured to receive $I_{sense}$ which is proportional to $I_C$ at one input and a DC supply voltage (i.e. the voltage at a node A) at another input. A feedback voltage may be generated and input to the positive terminal of differential amplifier 232, which corresponds to the product of $I_{sense}$ and the DC supply voltage at node A ($V_{node\ A}$). This product of $I_{sense}$ and $V_{node\ A}$ is also proportional to the DC power provided to PA 220 by power control circuit 210. In some embodiments, the feedback voltage is proportional to the square root of the product of $I_{sense}$ and $V_{node\ A}$. As a result, in power control circuit 210, the configuration of analog multiplier circuit 237, differential amplifier 220, and the current mirror comprising the transistor 236 and PMOS 232 forms a feedback loop for controlling the output voltage provided to PA 220.

In some embodiments, $V_{RAMP}$ 233 is coupled to the negative terminal of differential amplifier 232 through a squarer circuit 238 as shown in FIG. 2. Square circuit 238 takes an analog signal as an input and outputs the square of the signal. The output of the LDO circuit is coupled to the collector of PA 220 through the inductor 230. This may be achieved by connecting one of the terminal of inductor 230 to the collector of the transistor of PA 220. Another terminal of inductor 230 is coupled to the output of the LDO circuit and also to a capacitor 239 which is then grounded as shown in FIG. 2. In some embodiment, capacitor 239 may be an on-chip decoupling capacitor which has capacitance in pF and may be adjusted based on area available in layout of the circuit.

In some embodiments, the base of PA 220 may be coupled to the base bias circuit. The base bias circuit is set by a reference voltage. The reference voltage may be a $V_{RAMP}$ 241 and/or a temperature compensation reference (TC) 242, which may be coupled to a multiplexer (MUX) 243. MUX 243 may select a reference voltage, such as $V_{RAMP}$ 241 or multiplex more than one voltage references and output to a voltage-to-current converter 244, as shown in FIG. 2. The converted current from the reference voltage is then processed by a digital-to-analog converter (DAC) 245, in which the digital current signal is converted into analog current signal. In some other embodiments, DAC 245 may be configured to a current mirror which is not shown in FIG. 2. This converted current is served as a base bias current which is subsequently input to a base current converter 246. Base current converter 246 is configured to convert base bias current to base current ($I_B$) of PA 220 at the base of PA 220.

When power control circuit 210 is in operation, the collector voltage of PA 220 is set by the LDO of power control circuit 210. All the PA current flows through PMOS pass gate 233 of the LDO. In some embodiment, this current which flows through PMOS pass gate 233 may be as high as 3 A which results in high power dissipation across PMOS pass gate 233. This power dissipation causes die temperature to increase and potentially destroys the PMOS pass gate 233. Therefore, an over temperature detection and protection mechanism is needed to protect the PMOS pass gate from heating up.

Figure 3:
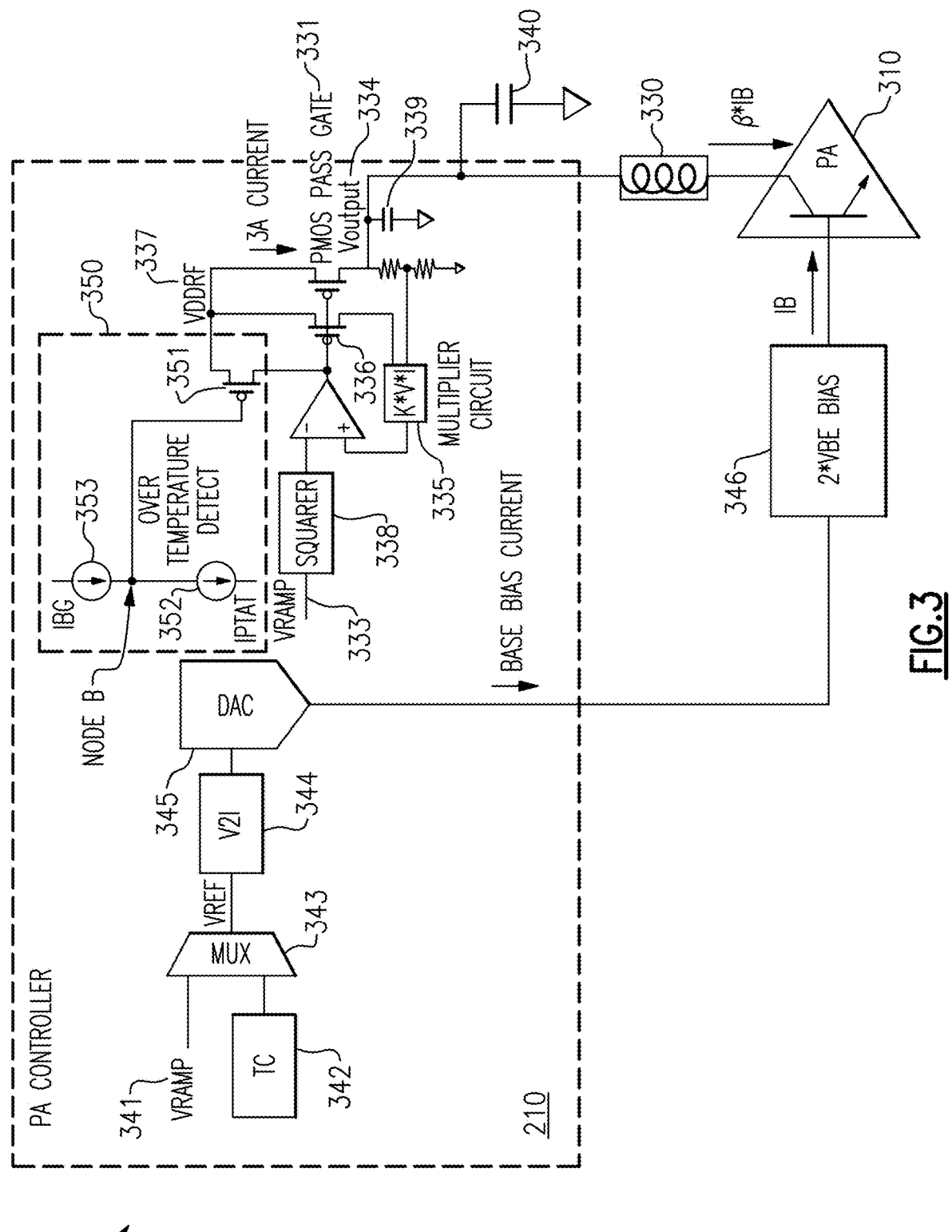
FIG. 3 is a detailed circuit diagram of an amplification module 300 including a conventional protective circuit for over temperature protection according to aspects of the present invention.

FIG. 3 shows a circuit diagram of an amplification module 300 including an over temperature protection circuit 350 at the gate of PMOS pass gate 331. The protective circuit 350 shown in FIG. 3 includes a transistor 351, a proportional-to-absolute-temperature-current-source ($I_{PTAT}$) 352 and a bandgap-reference-current ($I_{BG}$) 353. Proportional-to-absolute-temperature-current-sources are widely used to generate bias currents and as temperature sensor in temperature measurement systems. The bandgap reference is a temperature-independent reference, which is serves as an indicator of a threshold of current corresponding to a certain temperature (range). In some embodiments, the temperature threshold is set at 160° C.

$I_{PTAT}$ 352 and $I_{BG}$ 353 current sources are connected to each other through a node B in an opposite direction as shown in FIG. 3. The resultant current at node B is configured to flow to the gate of transistor 351, so that transistor 351 is controlled by this resultant current from $I_{PTAT}$ 352 and $I_{BG}$ 353. The resultant current is the two currents of $I_{PTAT}$ 352 and $I_{BG}$ 353 subtract from each other. $I_{PTAT}$ 352 and $I_{BG}$ 353 current sources are coupled to the LDO circuit through transistor 351 at node B, so that the resultant current at node B takes control of transistor 351 and accordingly controls PMOS pass gate 331. The gate of transistor 351 is coupled to $I_{PTAT}$ 352 and $I_{BG}$ 353 at node B, the drain of transistor 351 is coupled to supply voltage VDD 337 and the source of transistor 351 is coupled to the gate of a transistor 336.

When in operation, $I_{PTAT}$ as a temperature sensor constantly monitors the temperature of the circuit. However, $I_{BG}$ as a temperature-independent reference does not change over temperature. When the temperature increases above the threshold temperature (e.g. 160° C.), $I_{PTAT}$ starts to be higher than $I_{BG}$ which leads to an increase in the resultant current at node B. Accordingly, the gate voltage of transistor 351 is increased which then leads to an increase in the voltage between the drain and source ($V_{DS}$) of PMOS pass gate 331. The resistance of PMOS pass gate 331 is therefore increased with the increased $V_{DS}$. As a result, the current which flows through PMOS pass gate 331 is decreased due to the increased resistance, which then reduces the power dissipation across PMOS pass gate 331.

However, this over temperature protection mechanism may have some drawbacks. A set of simulation results of the amplification module 300 with this over temperature protection is demonstrated in FIG. 4.

Figure 4:
FIG. 4 is a simulation plot of voltage, current and resistance changes with respect to temperature changes within the circuit shown in FIG. 3 according to aspects of the present invention.

FIG. 4 shows a plot of simulations results according to the circuit diagram demonstrated in FIG. 3. The plot includes four curves, namely a first curve 410 which represents $V_{DS}$ of PMOS pass gate 331, a second curve 420 which represents PA current (same as current through PMOS pass gate 331), a third curve 430 which represents power dissipated in PMOS pass gate 331, and a fourth curve 440 which represents resistances of PMOS pass gate. Their changes over a temperature range (from 0° C. to 200° C.) are shown and discussed.

When the temperature remains low, there is no change in the LDO circuit because the over temperature protective circuit 350 has not been activated. The resistance of PMOS pass gate 331 is very low (e.g. around 0.5 ohm). However, as the temperature goes higher, the over temperature protective circuit 350 is activated which leads to an increase in gate voltage of PMOS pass gate 331 and also an increase in its resistance. As shown by curve 440 in FIG. 4, when the temperature reaches around 148° C. as indicated at the reference line, the resistance of PMOS pass gate 331 increases to around 1.5 ohm which matches the impedance of PA 310 (also around 1.5 ohm). This impedance match of source and load may cause maximum power dissipation in PMOS pass gate 331 which leads to a peak in power dissipation as shown by curve 430.

As the resistance of PMOS pass gate 331 increases above 1.5 ohm at higher temperature, this maximum power dissipation disappears. Instead, a significant decrease in power dissipation of PMOS pass gate 331 can be seen by curve 430. PA current shown by curve 420 is also decreased accordingly, which is an indication of the effect by the over temperature protective circuit 350.

Although this over temperature protective circuit 350 has an effect on reducing the power dissipation of PMOS pass gate 331, the power dissipation spike before reducing is undesirable and needs to be improved.

FIG. 5 shows a circuit diagram of an amplification module 500 having an improved over temperature protection circuit 550 in accordance with one embodiment of the present invention. This over temperature protection 550 is coupled to a node between the multiplexer (MUX) 543 and the voltage-to-current converter 544. The node is referred to as $V_{REF}$ 551 as shown in FIG. 5.

Over temperature protection circuit 550 includes a $I_{PTAT}$ 554 and a $I_{BG}$ 555 connected in an opposite direction at a node C. Over temperature protection circuit 550 also includes a current mirror consisting of two transistors, namely transistor 552 and transistor 553. The two transistors may be both NMOS transistors. The gates of transistor 552 and transistor 553 are connected to each other. The sources of the two transistors are also connected to each other. Transistor 553 has its gate and drain connected. $I_{PTAT}$ 554 and a $I_{BG}$ 555 current sources are coupled to the current mirror through a node between the two gates of transistor 552 and transistor 553. The drain of transistor 552 is coupled to the node of $V_{REF}$ 551.

$I_{PTAT}$ 554 current source is used to generate bias currents and used as a temperature sensor. $I_{BG}$ 555 is a temperature-independent reference, which is serves as an indication of a threshold of current corresponding to a certain temperature (range). In some embodiments, the temperature threshold is set at 160° C. $I_{BG}$ 555 may be variable according to different applications.

When in operation, $I_{PTAT}$ 554 continuously monitors the temperature of the circuit and compares with the fixed reference $I_{BG}$ 555. Since the current sources of $I_{PTAT}$ 554 and $I_{BG}$ 555 are in an opposite direction, the resultant current at node C is a current difference between $I_{PTAT}$ 554 and $I_{BG}$ 555. When the temperature reaches higher than the temperature threshold reflected by $I_{BG}$ 555, a significant current difference may be output from node C which is coupled to the current mirror constructed by transistor 552 and transistor 553. The resultant current difference is therefore "mirrored" to the coupled base bias circuit at node $V_{REF}$ 551. Therefore, a current sink ($I_{sink}$) is achieved which is proportional to the temperature difference between the monitored temperature (T) of the circuit and the threshold temperature ($T_{threshold}$). It can be expressed that $I_{sink}$ is proportional to $K \times (T-T_{threshold})$, where K is a NMOS current mirror ratio.

Therefore, the voltage at node $V_{REF}$ 551 is pulled down by this $I_{sink}$, which leads to a reduction in base current $I_B$ after the processing of voltage-to-current converter 544, DAC 545 and base current converter 546. Due to the fact that PA collector current is proportional to its base current $I_B$ and the current through PMOS pass gate 531 is set by PA collector current, the reduced $I_B$ leads to a decrease in the current through PMOS pass gate 531. The power dissipated across PMOS pass gate 531 is therefore decreased.

Figure 6:
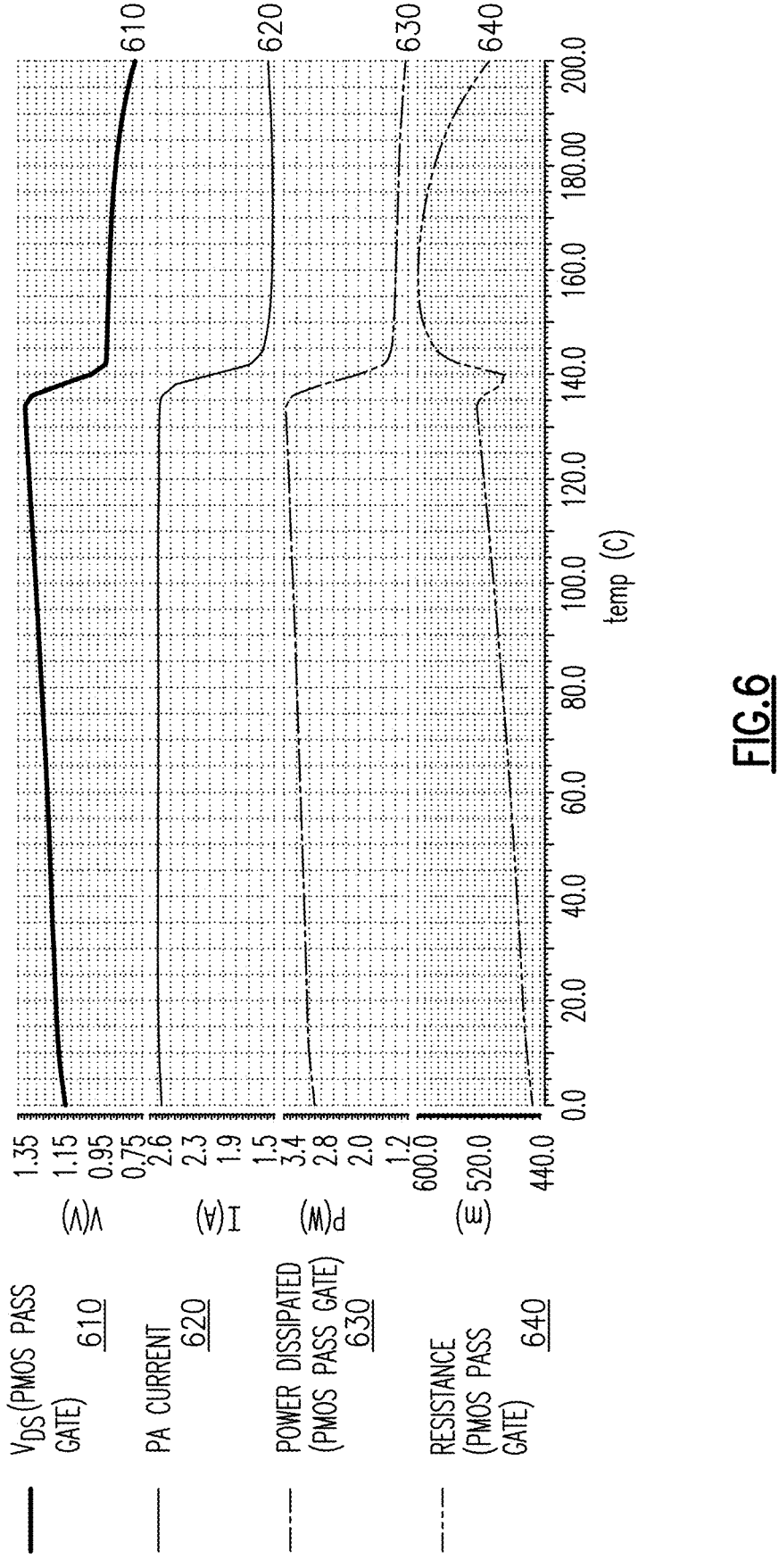
FIG. 6 is a simulation plot of voltage, current and resistance changes with respect to temperature changes within the circuit shown in FIG. 5 according to aspects of the present invention.

FIG. 6 shows a plot of simulation results according to the circuit diagram illustrated in FIG. 5. The plot includes four curves, namely a first curve 610 which represents $V_{DS}$ of the PMOS pass gate 531, a second curve 620 which represents PA current (same as current through PMOS pass gate 531), a third curve 630 which represents power dissipated in PMOS pass gate 531, and a fourth curve 640 which represents resistances of PMOS pass gate 531. A threshold temperature of 130° C. is set at over temperature protection circuit 550. Their changes over a temperature range (from 0° C. to 200° C.) are discussed below.

Within the temperature range below 130° C., over temperature protection circuit 550 has not been activated. As the temperature increases, the resistance of the PMOS pass gate 531 increases gradually. Therefore, a small gradual increase in $V_{DS}$ and power dissipated across PMOS pass gate 531 can be seen from 0° C. to 130° C., as demonstrated by curve 630. At the same time, the PA current as shown by curve 620 is almost constant. Slightly after a temperature of 130° C., the power dissipated in the PMOS pass gate 531 decreases significantly from 3.36 watt to 1.42 watt. This is because when the temperature is higher than the threshold temperature, the over temperature protection circuit 550 is activated by the current difference at a node C which originates from the higher $I_{PTAT}$ 554 compared with $I_{BG}$ 555. This current difference is mirrored by the current mirror to $I_{sink}$ which pulls down $V_{REF}$ 551 gradually with further increase in temperature. As a result, the PA current is also reduced with increase in temperature as shown by curve 620 in FIG. 6. Since the current that flows through PMOS pass gate 531 is set by PA collector current, it is also reduced with the increased temperature. Therefore, the power dissipation in the PMOS pass gate 531 is reduced continuously over the increase in temperature as shown by curve 630 in FIG. 6. In comparison to the conventional over temperature protection method described in FIGS. 3 and 4, the over temperature protection circuit 550 in FIG. 5 controls the power dissipation in the PMOS pass gate 531 by directly reducing the base current of PA 510 and does not cause any sudden peak in power dissipation.

In some embodiments, transistor 552 may be variable to control the NMOS mirror ratio K. As the temperature increases gradually and exceeds the threshold temperature, NMOS mirror generates $I_{sink}$ which starts pulling $V_{REF}$ 551 down. The rate of pulling down of $V_{REF}$ is determined by NMOS mirror ratio K. If K is high, $V_{REF}$ 551 is pulled down faster; and if K is low, $V_{REF}$ 551 is pulled down slower when temperature is increased further. As a result, $V_{REF}$ 551 is pulled down gradually with increase in temperature in a controllable rate rather than pulling to zero directly. Accordingly, the coupled PA base current is also reduced gradually with increase in temperature rather than shutting down. Therefore, this control is referred to as an over temperature shutdown control.

Figure 7:
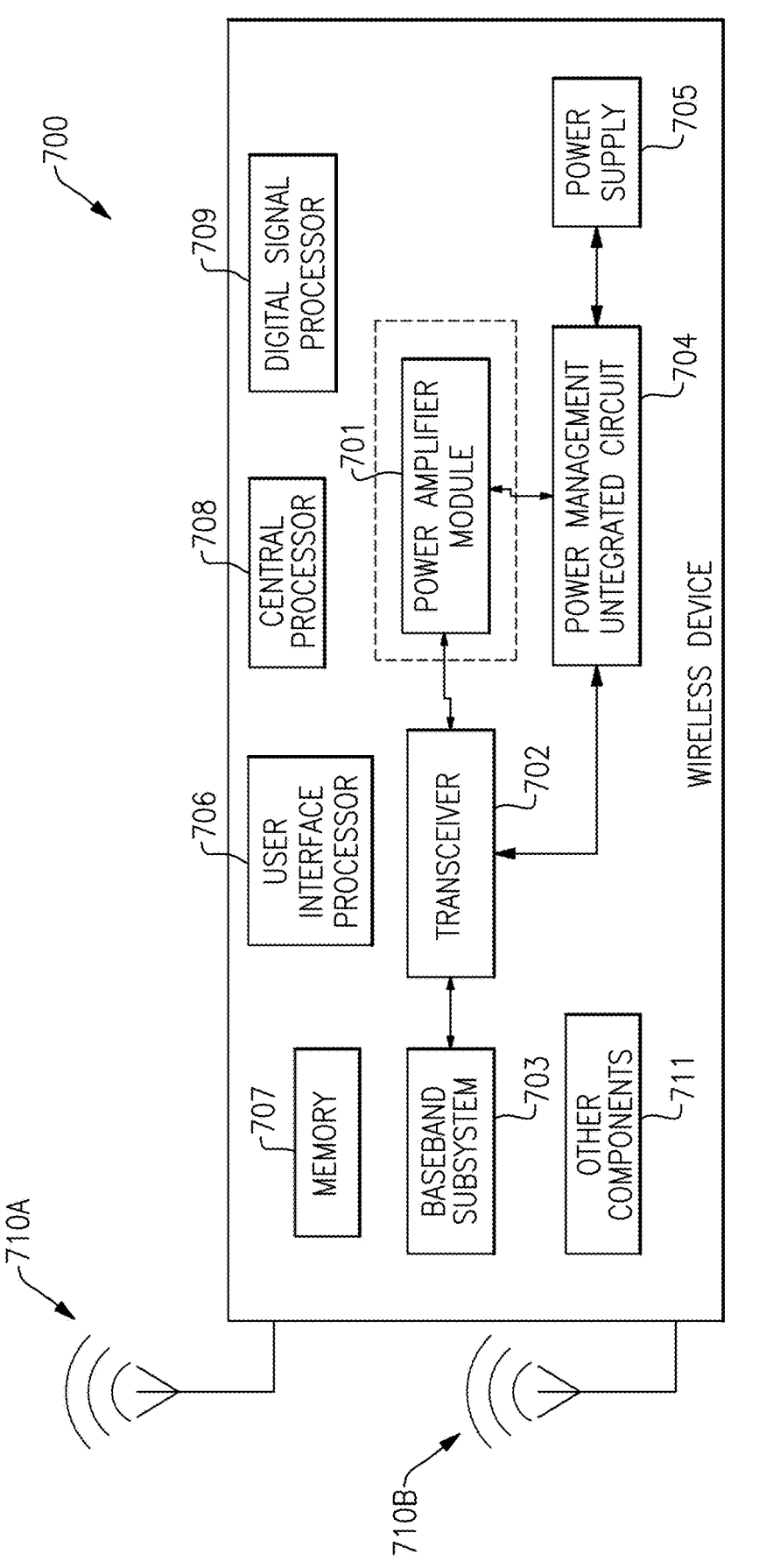
FIG. 7 is a schematic block diagram showing an application of the power amplification module within a wireless device according to aspects of the present invention.

FIG. 7 shows an example of application of a power amplifier module 701 in a wireless device 700. The power amplifier module 701 includes a power control unit and a power amplifier. The power amplifier module 701 can receive RF signals from a transceiver 702 that can be configured to generate radio frequency (RF) signals to be amplified and transmitted, and to process received signals.

The transceiver 702 may be interact with a baseband subsystem 703 that is configured to provide conversion between data and/or voice signals suitable for a user to consume and RF signals suitable for operation of the transceiver 702. The transceiver 702 may also be connected to a power management integrated circuit 704 that is configured to manage power for the operation of the wireless device 700. The power management integrated circuit 704 may be coupled to a power supply 705 and may modify the voltage of the power supply 705 to be within a desired operating range for one or more elements of the wireless device 700.

The baseband subsystem 703 may be connected to a user interface processor 706 that may facilitate input and output of voice and/or data provided to and received from the user. The baseband subsystem 703 may also be coupled to a memory 707 that may be configured to store data and/or instructions to facilitate the operation of the wireless device 700, and/or to provide storage of information for the user.

In addition, the wireless device 700 may further include one or more central processors 708, a digital signal processor 709, one or more antennas 710A, 710B, and other components 711. The one or more antennas 710A, 710B may be configured to transmit and receive at different frequencies or within different frequency ranges.

Figure 8:
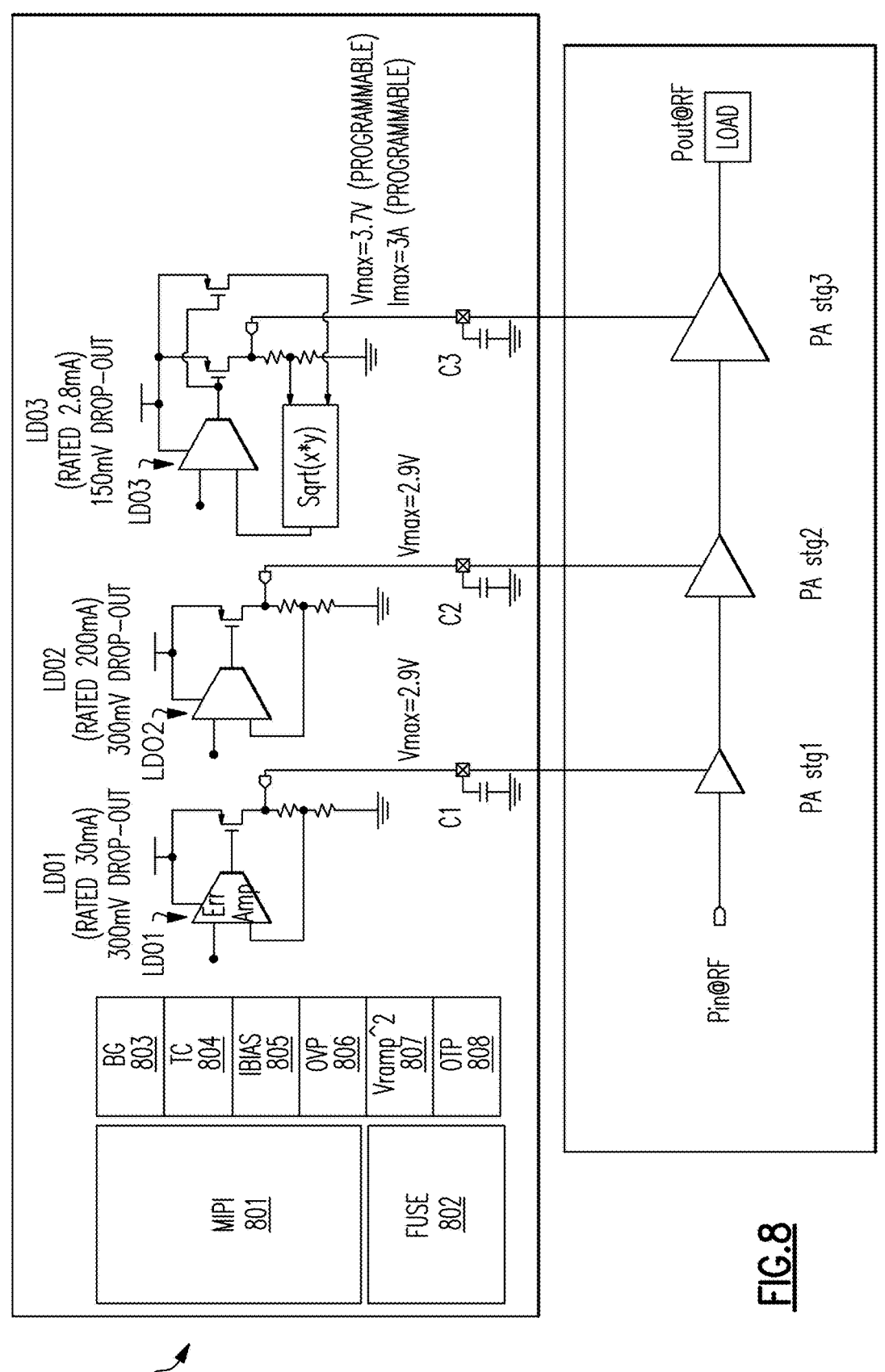
FIG. 8 is a schematic example of the configuration within the power amplifier module according to aspects of the present invention.

FIG. 8 shows an example of the configuration within the power amplifier module 800 which consists of a set of LDO components and the respectively coupled PA components.

As shown in FIG. 8, the power amplifier module 800 is a three-stage module including stage 1, stage 2 and stage 3. Each stage includes a power amplifier coupled to a corresponding LDO circuit for supply. Stage 1 includes PA stg 1 coupled to LDO1, stage 2 includes PA stg 2 coupled to LDO 2 and stage 3 includes PA stg 3 coupled to LDO 3. The drop-out voltage of each stage may be set differently, namely 300 mV at LDO1, 300 mV at LDO2, and 150 mV at LDO3. On-chip decoupling capacitors with different capacitance may also be used at each stage, namely C1 (100 pF to 2 nF), C2 (200 pF to 10 nF) and C3 (2 nF to 20 nF). Most of power output is dictated by PA stg 3. As shown in FIG. 8, power control loop is added to LDO 3 only. LDO1 and LDO2 are voltage regulators.

Power amplifier module 800 may also include a MIPI 801 on the same chip of the set of LDO components. MIPI 801 is a serial interface to baseband processor or transceiver chip shown in FIG. 7. A bias current and an over voltage threshold may therefore be changed by the baseband processor control through clock and data writing sequence. Power amplifier module 800 may also include a fuse 802 which is one-time programmable on chip memory used for trimming by automatic test equipment (ATE).

Power amplifier module 800 may also include a bandgap reference (BG) 803, temperature compensated reference (TC) 804 which takes bandgap reference and adds temperature dependent slope based on the need, bias current (IBIAS) 805 which converts TC voltage 804 to current to bias PA base and other internal circuits within LDO chip, over voltage protection (OVP) 806, squared $V_{RAMP}$ ($V_{RAMP}^2$) 807 for feeding to LDOs, and over temperature protection (OTP) 808.

The invention claimed is:

1. A power control circuit coupled to a power amplifier, said power control circuit comprising:

a first circuit including a power supply and a first transistor to provide a first current to the power amplifier through the first transistor;

a second circuit to provide a second current to the power amplifier, the power dissipation of the first current being dependent on the second current of the power amplifier;

a protective circuit coupled to the second circuit, the protective circuit configured to pull down a voltage of the second circuit when the temperature of the power control circuit exceeds a threshold temperature, such that the second current provided to the power amplifier by the second circuit is reduced and the power dissipation in the first transistor of the first circuit is reduced with increasing temperature.

2. The power control circuit according to claim 1 wherein the protective circuit is coupled to the second circuit at a reference node, such that the voltage at the reference node is pulled down by the current generated by the protective circuit.

3. The power control circuit according to claim 2 wherein the protective circuit includes a proportional-to-absolute-temperature-current-source which is configured to sense the temperature of the power control circuit; a bandgap-reference-current-source which is configured to set a threshold current corresponding to a threshold temperature; and a current mirror including a second transistor and a third transistor with their gates connected to each other, coupled between a node where the proportional-to-absolute-temperature-current-source and the ent-source are connected and the reference node of the second circuit.

4. The power control circuit according to claim 1 wherein the first circuit is a voltage regulator which further includes an output coupled between the first transistor and the power amplifier which is adapted to deliver a regulated output voltage to the power amplifier; and a differential amplifier configured to provide a feedback from the regulated output voltage to the first transistor.

5. The power control circuit of claim 4 wherein the differential amplifier includes a first input configured to provide a first reference voltage to the differential amplifier; a second input configured to provide a feedback voltage; and an output of control signal coupled to the first transistor.

6. The power control circuit according to claim 4 wherein the first circuit further includes: a squarer circuit coupled between the first reference voltage and the first input of the differential amplifier; a fourth transistor coupled between the gate of the first transistor and the output of the differential amplifier; and a multiplier circuit coupled to the second input of the differential amplifier at one side and coupled to the drains of the first and fourth transistors at another side, which is configured to receive the voltage and current from the first and fourth transistors and output a feedback voltage to the second input of the differential amplifier.

7. The power control circuit according to claim 4 wherein the first circuit is coupled to the power amplifier through an inductor.

8. The power control circuit according to claim 1 wherein the second circuit includes a second reference voltage, and a voltage-to-current converter configured to convert the second reference voltage to a base bias current.

9. The power control circuit according to claim 8 wherein the second circuit further includes a temperature compensation reference, and a multiplexer configured to receive the temperature compensation reference and the second reference voltage and to output a multiplexed voltage to the voltage-to-current converter.

10. The power control circuit according to claim 8 wherein the second circuit further includes a digital-to-analog converter coupled to the voltage-to-current converter.

11. The power control circuit according to claim 8 wherein the second circuit is coupled to the power amplifier through a base current converter, which is configured to convert the base bias current to the second current provided to the power amplifier.

12. The power control circuit according to claim 1 wherein the threshold temperature is set at between 130 to 160° C.

13. A method of controlling a power amplifier, the method comprising:

coupling a power supply and a first transistor of a first circuit of a power control circuit to the power amplifier for providing a first current to the power amplifier through the first transistor;

coupling a second circuit of the power control circuit to the power amplifier for providing a second current to the power amplifier, the power dissipation of the first current being dependent on the second current of the power amplifier;

coupling a protective circuit of the power control circuit to the second circuit;

pulling down a voltage of the second circuit when a temperature of the power control circuit exceeds a threshold temperature;

reducing the second current provided to the power amplifier by the second circuit; and reducing a power dissipation in the first transistor of the first circuit with increasing temperature.

14. The method of controlling a power amplifier according to claim 13 further includes coupling the protective circuit to the second circuit at a reference node, such that the voltage at the reference node is pulled down by the current generated by the protective circuit.

15. The method of controlling a power amplifier according to claim 13 further comprising:

sensing the temperature by a proportional-to-absolute-temperature-current-source;

setting a threshold current corresponding to a threshold temperature by a bandgap-reference-current-source;

coupling a node where the proportional-to-absolute-temperature-current source and the bandgap-reference-current-source are connected with the reference node of the second circuit through a current mirror, the current mirror including a second transistor and a third transistor with their gates connected to each other.

16. The method of controlling a power amplifier according to claim 13 wherein the first circuit is a voltage regulator which further includes:

coupling an output between the first transistor and the power amplifier for delivering a regulated output voltage to the power amplifier;

providing a feedback from the regulated output voltage to the first transistor by a differential amplifier;

providing a first reference voltage to a first input of the differential amplifier;

providing a feedback voltage to a second input of the differential amplifier; and coupling an output of control signal to the first transistor.

17. The method of controlling a power amplifier according to claim 13 further comprising, with the second circuit, applying a second reference voltage, and converting the reference voltage to a base bias current by a voltage-to-current converter.

18. The method of controlling a power amplifier according to claim 17 further comprising:

coupling a squarer circuit of the first circuit between the first reference voltage and the first input of the differential amplifier;

coupling a fourth transistor of the first circuit between the gate of the first transistor and the output of the differential amplifier;

coupling a multiplier circuit of the first circuit to the second input of the differential amplifier at one side and coupled to the drains of the first and fourth transistors at another side;

receiving the voltage and current from the first and fourth transistors; and outputting a processed signal to the second input of the differential amplifier.

19. The method of controlling a power amplifier according to claim 17 further comprising, with the second circuit, applying a temperature compensation reference, and receiving the temperature compensation reference and the second reference voltage and outputting a multiplexed voltage to the voltage-to-current converter by a multiplexer.

20. The method of controlling a power amplifier according to claim 13 further includes setting the threshold temperature at between 130 to 160° C.

\*   \*   \*   \*   \*